United States Patent
Ngo et al.

(10) Patent No.: US 6,521,529 B1
(45) Date of Patent: Feb. 18, 2003

(54) HDP TREATMENT FOR REDUCED NICKEL SILICIDE BRIDGING

(75) Inventors: Minh Van Ngo, Fremont, CA (US); Christy Mei-Chu Woo, Cupertino, CA (US); Ercan Adem, Sunnyvale, CA (US); Robert A. Huertas, Hollister, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2 days.

(21) Appl. No.: 09/679,880

(22) Filed: Oct. 5, 2000

(51) Int. Cl.$^7$ ................................. H01L 21/44
(52) U.S. Cl. .............. 438/664; 438/664; 438/184; 438/265; 438/647; 438/649; 438/656; 257/382; 257/384; 257/755; 257/768; 257/900
(58) Field of Search ................. 438/664, 184, 438/230, 265, 303, 595, 647–663; 257/900, 382–384, 410–411, 413, 751, 755, 768

(56) References Cited

U.S. PATENT DOCUMENTS

| | | | | |
|---|---|---|---|---|
| 5,434,109 A | * | 7/1995 | Geissler et al. | 437/239 |
| 5,759,906 A | * | 6/1998 | Lou | 438/623 |
| 5,804,492 A | * | 9/1998 | Shen | 438/439 |
| 6,001,721 A | * | 12/1999 | Huang | 438/597 |
| 6,046,089 A | * | 4/2000 | Gardner et al. | 438/303 |
| 6,074,921 A | * | 6/2000 | Lin | 438/299 |
| 6,127,238 A | * | 10/2000 | Liao et al. | 438/382 |
| 6,129,819 A | * | 10/2000 | Shan et al. | 204/192.3 |
| 6,165,915 A | * | 12/2000 | Jang | 438/787 |
| 6,211,035 B1 | * | 4/2001 | Moise et al. | 438/396 |
| 6,217,658 B1 | * | 4/2001 | Orczyk et al. | 118/697 |
| 6,218,251 B1 | * | 4/2001 | Kadosh et al. | 438/303 |
| 6,218,275 B1 | * | 4/2001 | Huang et al. | 438/595 |
| 6,228,730 B1 | * | 5/2001 | Chen et al. | 438/301 |
| 6,245,669 B1 | * | 6/2001 | Fu et al. | 438/636 |
| 6,268,297 B1 | * | 7/2001 | Nag et al. | 438/783 |
| 6,323,561 B1 | * | 11/2001 | Gardner et al. | 257/900 |
| 6,326,263 B1 | * | 12/2001 | Hsieh | 438/257 |
| 2001/0053426 A1 | * | 12/2001 | Li et al. | 427/569 |
| 2002/0000622 A1 | * | 1/2002 | Yamakawa et al. | 257/384 |

FOREIGN PATENT DOCUMENTS

EP  0928015 A2  * 12/1998  ........... H01L/21/28

* cited by examiner

*Primary Examiner*—Matthew Smith
*Assistant Examiner*—Granvill D Lee, Jr.

(57) ABSTRACT

Bridging between nickel silicide layers on a gate electrode and source/drain regions along silicon nitride sidewall spacers is prevented, after silicidation and removal of any unreacted nickel, by treating the exposed surfaces of the silicon nitride sidewall spacers with a HDP plasma to oxidize nickel silicide thereon forming a surface layer comprising silicoin oxide and silicon oxynitride. Embodiments include treating the silicon nitride sidewall spacers with a HDP plasma to form a surface silicon oxide/silicon oxynitride region having a thickness of about 40 Å to about 50 Å.

19 Claims, 2 Drawing Sheets

HDP TREATMENT FOR REDUCED NICKEL SILICIDE BRIDGING

This application contains subject matter similar to subject matter disclosed in U.S. patent application: Ser. No. 09/379,372, filed on Oct. 5, 2000; Ser. No. 09/679,373, filed on Oct. 5, 2000; Ser. No. 09/679,374, filed on Oct. 5, 2000; Ser. No. 09/679,375, filed on Oct. 5, 2000; and Ser. No. 09/679,871, filed on Oct. 5, 2000.

TECHNICAL FIELD

The present invention relates to the fabrication of semiconductor devices, particularly to self-aligned silicide (salicide) technology, and the resulting semiconductor devices. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate exhibiting the requisite reliability. High performance microprocessor applications require rapid speed of semiconductor circuitry. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicides have been employed in salicide technology, such as titanium, tungsten, and cobalt. Nickel, however, offers particularly advantages vis-à-vis other metals in salicide technology. Nickel requires a lower thermal budget in that nickel silicide and can be formed in a single heating step at a relatively low temperature of about 250° C. to about 600° C. with an attendant reduction in consumption of silicon in the substrate, thereby enabling the formation of ultra-shallow source/drain junctions.

In conventional salicide technology, a layer of the metal is deposited on the gate electrode and on the exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it was also found advantageous to employ silicon nitride sidewall spacers, since silicon nitride is highly conformal and enhances device performance, particularly for p-type transistors. However, although silicon nitride spacers are advantageous from such processing standpoints, it was found extremely difficult to effect nickel silicidation of the gate electrode and source/drain regions without undesirable nickel silicide bridging and, hence, short circuiting, therebetween along the surface of the silicon nitride sidewall spacers.

Accordingly, there exists a need for salicide methodology enabling the implementation of nickel silicide interconnection systems without bridging between the nickel silicide layers on the gate electrode and the source/drain regions, particularly when employing silicon nitride sidewall spacers on the gate electrode.

DISCLOSURE OF THE INVENTION

An advantage of the present invention is a method of manufacturing a semiconductor device having nickel silicide contacts on a gate electrode and associated source/drain regions without bridging therebetween along insulative sidewall spacers, notably silicon nitride sidewall spacers.

Another advantage of the present invention is a semiconductor device having nickel silicide contacts on a gate electrode and associated source/drain regions without bridging therebetween along insulative sidewall spacers, particularly silicon nitride sidewall spacers.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon gate electrode having opposing side surfaces on a substrate with a gate insulating layer therebetween; forming silicon nitride sidewall spacers on the opposing side surfaces of the gate electrode leaving exposed adjacent surfaces of the substrate; depositing a layer of nickel on the gate electrode and on the exposed substrate surfaces; heating to react the layer of nickel with underlying silicon to form a layer of nickel silicide on the gate electrode and layers of nickel silicide on the exposed surfaces of the substrate; removing unreacted nickel from the silicon nitride sidewall spacers; and treating the silicon nitride sidewall spacer with a high density oxygen plasma (HDP) to oxidize any nickel silicide formed on the spacers.

Another aspect of the present invention is a semiocnductor device comprising: a gate electrode, having opposing side surfaces, and an upper surface, on a semiconductor substrate with a gate insulating layer therebetween; silicon nitride sidewall spacers on the opposing side surfaces of the gate electrod; a layer,containing silicon oxide and silicon oxynitride, on a surface of each silicon nitride sidewall spacer; a layer of nickel silicide on the upper surface of the gate electrode; and a layer of nickel silicide on the substrate surface adjacent each silicon nitride sidewall spacer.

Embodiments of the present invention include treating the silicon nitride spacers thereon, thereby forming a layer, comprising silicon oxide and silicon oxynitride and having a refractive index less than about 1.95, on the silicon nitride sidewall spacers. Embodiments of the present invention also include selectively oxidizing the nickel suicide formed on the sidewall spacers, as well as removing any oxidized layer formed on the nickel silicide source/drain contacts Embodiments of the present invention further include forming an oxide liner on the opposing side surfaces of the gate electrode prior to forming the silicon nitride sidewall spacers, and forming the nickel silicide layers at a temperature of about 400° C. to about 600° C.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
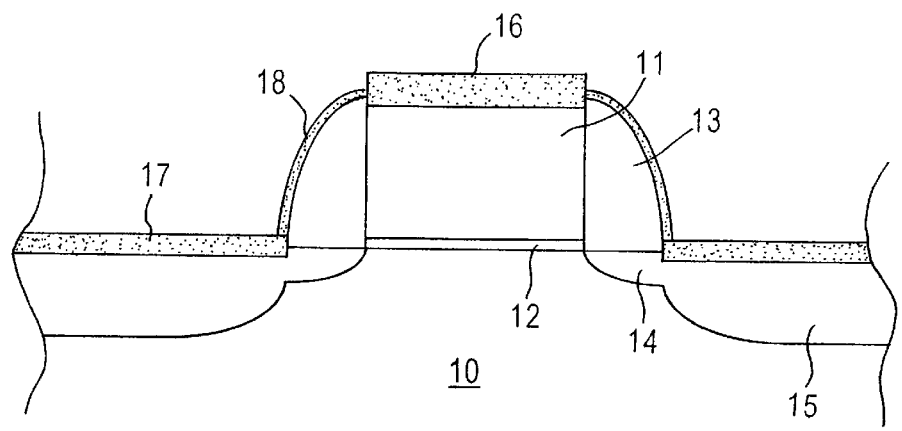
FIG. 1 schematically illustrates problematic nickel silicide bridging attendant upon conventional practices.

The present invention addresses and solves problems attendant upon implementing conventional salicide technology employing nickel as the metal for silicidation. As device geometries shrink into the deep sub-micron regime, nickel silicide bridging occurs along the surface of silicon nitride sidewall spacers between the nickel silicide layer on the gate electrode and nickel silicide layers on associated source/drain regions. For example, adverting to FIG. 1, a gate electrode 11 is formed on substrate 10 with gate insulating layer 12 therebetween. Silicon nitride spacers 13 are formed on opposing side surfaces of gate electrode 11. Shallow source/drain extensions 14 and source/drain regions 15 are formed in substrate. A layer of nickel is deposited followed by heating to form a nickel silicide layer 16 on the upper surface of gate electrode 11 and a layer of nickel silicide 17 on associated source/drain regions 15. However, it was found that a thin layer of nickel silicide 18, typically at a thickness of about 30 Å to about 60 Å, is undesirably formed along the exposed surfaces of the silicon nitride sidewall spacers 13 causing bridging and, hence, shorting between nickel silicide layer 16 and nickel silicide layers 17. After considerable experimentation and investigation, it was postulated that the problem of nickel silicide formation 18 along the silicon nitride sidewall spacers 13 stemmed from the reaction of nickel with dangling silicon bonds in the silicon nitride sidewall spacer.

In accordance with embodiments of the present invention, after removal of unreacted nickel, the surface of the silicon nitride sidewall spacers containing nickel silicide is treated with a HDP to oxidize the nickel silicide on the surface of the sidewall spacers to form a surface layer comprising silicon oxide and silicon oxynitride, thereby eliminating nickel silicide bridging between the nickel silicide contacts on the upper surface of the gate electrode and nickel silicide contacts on associated source/drain regions.

Conventional silicon nitride sidewall spacers exhibit a refractive index of about 1.98 to about 2.02, e.g., about 2. If the amount of silicon having dangling bonds is reduced, the refractive index is also reduced. Accordingly, embodiments of the present invention comprise treating the silicon nitride sidewall spacers in a HDP to form a surface layer thereon virtually free of silicon with dangling bonds and exhibiting a refractive index less than about 1.95, such as about 1.75 to about 1.85. Such a surface layer typically has a thickness of about 40 Å to about 50 Å.

Given the disclosed objectives and guidance of the present disclosure, the optimum conditions for HDP treatment of the silicon nitride sidewall spacers can be determined in a particular situation. For example, it was found suitable to treat the silicon nitride sidewall spacers at an oxygen flow rate of about 100 to about 500 sccm, a source power of about 2,800 watts to about 3,200 watts, a bias power of about 3,000 watts to about 3,800 watts, a pressure of about 3 to about 10 mTorr., and a temperature of about 400° C. to about 480° C., typically for about 5 seconds to about 30 seconds. Advantageously, treatment of the surface of the silicon nitride sidewall spacers with an HDP oxide oxidizes nickel silicide thereon, thereby forming an insulative layer comprising silicon oxide and silicon oxynitride. Accordingly, embodiments of the present invention enable nickel silicidation without undesirable nickel silicide bridging, such as that denoted by reference numeral 18 in FIG. 1.

Figure 2:
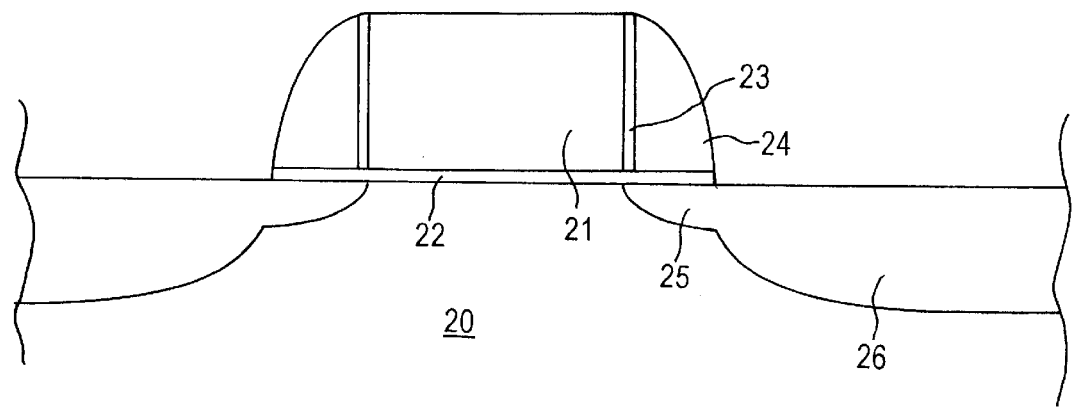
FIGS. 2–4 schematically illustrate sequential phases in accordance with an embodiment of the present invention, wherein like features are denoted by like reference numerals.
Figure 3:
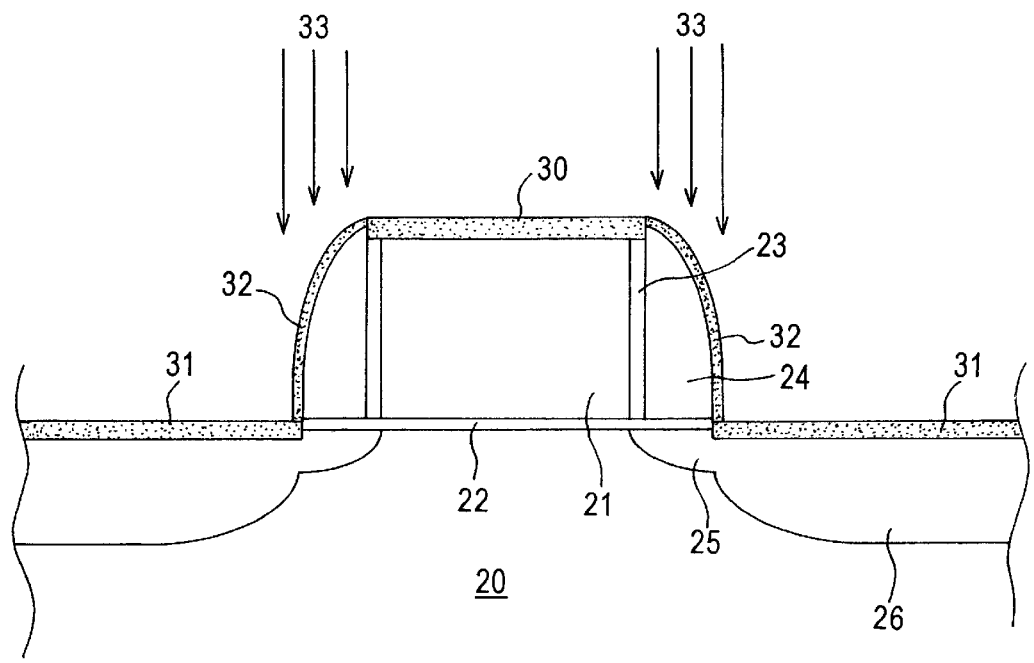
Figure 4:
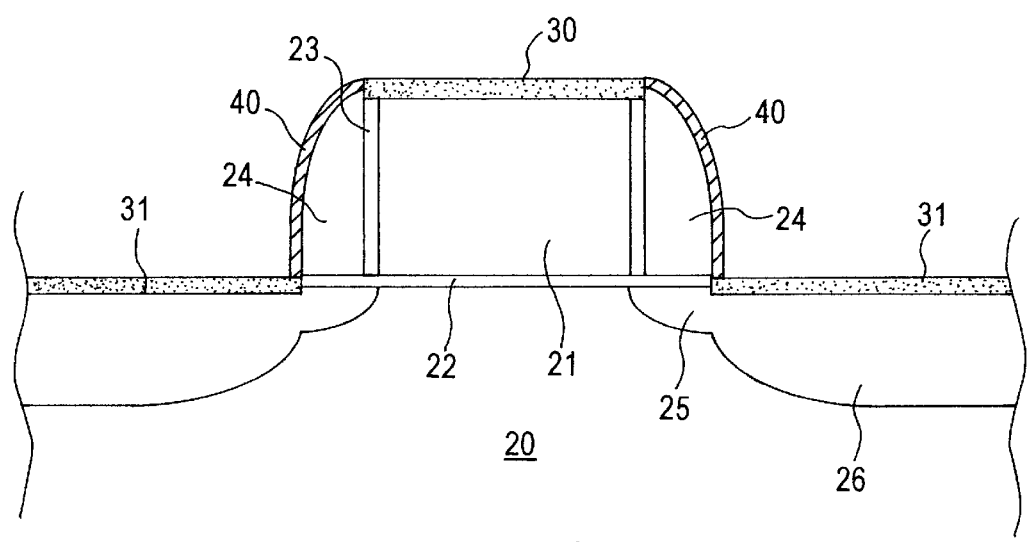

An embodiment of the present invention is schematically illustrated in FIGS. 2 through 4, wherein similar reference numerals denote similar features. Adverting to FIG. 2, a gate electrode 21, e.g., doped polycrystalline silicon, is formed on semiconductor substrate 20, which can be n-type or p-type, with a gate insulating layer 22 therebetween. Gate insulating layer 22 is typically silicon dioxide formed by thermal oxidation or chemical vapor deposition (CVD). In accordance with embodiments of the present invention, a thin oxide liner 23, as at a thickness of about 130 Å to about 170 Å, is formed on the opposing side surfaces of gate electrode 21. Silicon oxide liner can be formed by plasma enhanced chemical vapor deposition (PECVD) using silane at a flow rate of about 50 to about 100 sccm, $N_2O$ at a flow rate of about 1,000 to about 4,000 sccm, an RF power of about 100 watts to about 300 watts, a pressure of about 2.4 Torr. to about 3.2 Torr., and a temperature of about 380° C. to about 420° C., e.g., about 400° C. Silicon oxide liner 23 advantageously prevents consumption of the gate electrode 21 by silicidation from the side surfaces thereof.

Subsequent to forming silicon oxide liner 23, silicon nitride sidewall spacers 24 are formed by depositing a conformal layer and anisotropically etching. Silicon nitride sidewall spacers can be formed by PECVD employing a silane flow rate of about 200 to about 400 sccm, e.g, about 375 sccm, a nitrogen flow rate of about 2,000 to about 4,000 sccm, e.g., about 2,800 sccm, an ammonia flow rate of about 2,500 to about 4,000 sccm, e.g., about 3,000 sccm, a high frequency RF power of about 250 watts to about 450 watts, e.g., about 350 watts, a low frequency RF power of about 100 to about 200 watts, e.g., about 140 watts, a pressure of about 1.6 Torr. to about 2.2 Torr., e.g., about 1.9 Torr., and a temperature of about 380° C. to about 420° C., e.g., about 400° C. The silicon nitride sidewall spacers typically have a thickness of about 850 Å to about 950 Å and exhibit a refractive index of about 1.98 to about 2.02, e.g., about 2.0.

Prior to depositing nickel, it was found particularly suitable to conduct argon sputter etching to remove contamination. Sputter etching techniques are conventional and, hence, not set forth herein in detail. Such techniques are typically implemented in an inductively coupled plasma source sputter etch chamber in which a pedestal supports an electrostatic chuck and functions as an RF powered cathode. The chamber walls typically form an RF anode. An electrostatic attractive force is generated by the chuck to retain the wafer in a stationary position during processing. A voltage is applied to one or more electrodes embedded within a ceramic chuck body to induce opposite plurality charges in the wafer and electrodes, respectively. The opposite charges pull the wafer against the chuck support surface, thereby electrostatically clamping the wafer. An additional coil in the outside surface of the chamber lid is energized with RF power that inductively couples through the lid and into the chamber. The electric field generated between the anode and cathode along with the inductively coupled power from the coil ionizes a reactment gas introduced into the chamber, e.g., argon, to produce a plasma. Ions from the plasma bombard the wafer to effect etching.

Subsequent to sputter etching, the layer of nickel is deposited, as at a thickness of about 100 Å to about 300 Å, e.g., about 200 Å, followed by rapid thermal annealing, as at a temperature of about 250° C. to about 600° C., e.g., about 400° C. to about 600° C. During such thermal treatment, nickel silicide layer 30, illustrated in FIG. 3, is formed on gate electrode 21 while nickel silicide layers 31 are formed on exposed portions of the substrate adjacent sidewall spacers 24. Nickel silicide layers 30 and 31 typically have a thickness of about 100 Å to about 300 Å, e.g., about 200 Å. Unreacted nickel on the surfaces of the silicon nitride sidewall spacers 24 is then removed, as by a wet processing technique, e.g., treating with a mixture of sulfuric acid and hydrogen peroxide with a ratio of sulfuric acid: hydrogen peroxide of about 1:12 to about 1:4, e.g., about 1:2.

However, during silicidation, nickel silicide layers 32, typically having a thickness of about 30 Å to about 60 Å, are formed on the exposed surfaces of silicon nitride sidewall spacers 24, presumably by reaction of deposited nickel with dangling silicon bonds in sidewall spacers 24. These layers of nickel silicide 32 disadvantageously cause bridging and, hence, short circuiting, between nickel silicide layer 30 on gate electrode 21 and nickel silicide layers 31 on associated source/drain regions 26.

In accordance with embodiments of the present invention, such bridging is eliminated by treating sidewall spacers 24 with a HDP, indicated by arrows 33, to oxidize nickel silicide layers 32 as illustrated in FIG. 3. Such HDP treatment can be conducted at an oxygen ($O_2$) flow rate of about 100 to about 500 sccm, a source power of about 2,800 watts to about 3,200 watts, a bias power of about 3,000 watts to about 3,800 watts, a pressure of about 3 to about 10 mTorr, and a temperature of about 400° C. to about 480° C., typically for about 5 to about 30 seconds. The HDP 33 oxidizes nickel silicide layers 32 to form an insualting surface layer 40 illustrated in FIG. 4, comprising silicon and silicon oxynitride, typically at a thickness of about 40 Å to about 50 Å, on sidewall spacers 24. Thus, bridging between nickel silicide layer 30 and nickel silicide layer 31 is eliminated. Insulative surface layer 40 typically exhibits a refractive index less than about 1.95, e.g., less than about 1.85. Embodiments of the present invention include selectively treating the sidewall spacers with the HDP to oxidize nickel silicide thereon, or removing any oxide formed on the nickel silicide source/drain contacts after HDP exposure, as by treatment with RCA ($H_2O + H_2O_2 + NH_yOH$ at 5:1:1) clean with or HFdip(100HF:1$H_2O$).

The present invention, therefore, enables the implementation of nickel salicide methodology, advantageously utilizing silicon nitride sidewall spacers without bridging between the nickel silicide contact layer formed on the upper surface of the gate electrode and the nickel silicide contact layers formed on associated source/drain regions. The present invention is applicable to the production of any of various types of semiconductor devices. The present invention is particularly applicable in manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a silicon gate electrode, having opposing side surfaces, on a substrate with a gate insulating layer therebetween;

forming silicon nitride sidewall spacers on the opposing side surfaces of the gate electrode leaving exposed adjacent surfaces of the substrate;

depositing a layer of nickel on the gate electrode and exposed surfaces of the substrate; and heating to react the layer of nickel with underlying silicon to form a layer of nickel silicide on the gate electrode and layers of nickel silicide on the exposed surfaces of the substrate; and treating the silicon nitride sidewall spacers with a high density oxygen plasma (HDP) to oxidize any nickel silicide formed on the spacers.

2. The method according to claim 1, wherein a layer of nickel silicide having a thickness of about 30 Å to about 60 Å is formed on the silicon nitride sidewall spacers, the method comprising treating the silicon nitride sidewall spacers with the HDP to oxidize the layer of nickel silicide on the sidewall spacers to form a surface layer, containing silicon oxide and silicon oxynitride, on the sidewall spacers.

3. The method according to claim 2, comprising treating the silicon nitride sidewall spacers with the HDP to form the surface layer having a thickness of about 40 Å to about 50 Å.

4. The method according to claim 3, wherein the silicon nitride sidewall spacers having a refractive index of about 1.98 to about 2.02 and surface layer has a refractive index less than about 1.95.

5. The method according to claim 2, comprising treating the silicon nitride sidewall spacers with the HDP at:

an oxygen flow rate of about 100 to about 500 sccm;

a source power of about 2,800 to about 3,200 watts;

a bias power of about 3,000 to about 3,800 watts;

a pressure of about 3 to about 10 mTorr.; and temperature of about 400° C. to about 480° C.

6. The method according to claim 5, comprising treating the silicon nitride sidewall spacers with the HDP for about 5 seconds to about 30 seconds.

7. The method according to claim 2, comprising forming the silicon nitride sidewall spacers at a thickness of about 850 Å to about 950 Å.

8. The method according to claim 2, comprising forming source/drain regions in the substrate proximate the opposing side surfaces of the gate electrode, wherein the nickel silicide layers on the exposed substrate surfaces function as source/drain contacts.

9. The method according to claim 8, comprising forming an oxide liner on the opposing side surfaces of the gate electrode before forming the silicon nitride sidewall spacers.

10. The method according to claim 9, comprising forming the oxide liner at a thickness of about 130 Å to about 170 Å.

11. The method according to claim 9, comprising depositing the layer of nickel at a thickness of about 100 Å to about 300 Å.

12. The method according to claim 9, comprising sputter etching in argon after depositing the layer of nickel.

13. The method according to claim 9, comprising heating at a temperature of about 400° C. to about 600° C. to form the layers of nickel silicide.

14. The method according to claim 1, comprising removing unreacted nickel from the silicon nitride sidewall spacers with a mixture comprising sulfuric acid and hydrogen peroxide.

15. A semiconductor device comprising:
   a gate electrode, having opposing side surfaces and an upper surface, on a semiconductor substrate with a gate insulating layer therebetween;
   silicon nitride sidewall spacers on the opposing side surfaces of the gate electrode;
   a layer, containing silicon oxide and silicon oxynitride, on the surface of each silicon nitride sidewall spacers;
   a layer of nickel silicide on the upper surface of the gate electrode; and
   a layer of nickel silicide on the substrate surface adjacent each silicon nitride sidewall spacer.

16. The semiconductor device according to claim 15, wherein the layer containing silicon oxide and silicon oxynitride has a thickness of about 40 Å to about 50 Å.

17. The semiconductor device according to claim 16, wherein the layer containing silicon oxide and silicon oxynitride bas a refractive index less than about 1.95.

18. The semiconductor device according to claim 15, further comprising an oxide liner on the opposing side surfaces of the gate electrode, with the silicon nitride sidewall spacers thereon.

19. The semiconductor device according to claim 18, wherein the oxide liner has a thickness of about 130 Å to about 170 Å.

* * * * *